United States Patent [19]

Ramsey

[11] Patent Number: 4,889,274
[45] Date of Patent: Dec. 26, 1989

[54] GAS MIXTURE FOR USE IN CONTROL AND FORMATION OF BALL BONDS

[75] Inventor: Thomas H. Ramsey, Garland, Tex.

[73] Assignee: Texas Instruments Incorporated, Dallas, Tex.

[21] Appl. No.: 171,611

[22] Filed: Mar. 22, 1988

[51] Int. Cl.$^4$ .............................................. B23K 35/38
[52] U.S. Cl. .................... 228/179; 228/218; 219/74
[58] Field of Search .............. 228/179, 214, 218; 219/56.1, 56.22, 74

[56] References Cited

U.S. PATENT DOCUMENTS

| | | | |
|---|---|---|---|
| 2,053,417 | 9/1936 | Brace | 219/74 |
| 2,497,631 | 2/1950 | Rothschild | 219/74 |
| 2,859,329 | 11/1958 | Lesnewich | 219/74 |
| 4,476,365 | 10/1984 | Kurty et al. | 219/74 |
| 4,558,200 | 12/1985 | Weigand, Jr. | 219/56.22 |
| 4,572,772 | 2/1986 | Peterson | 219/56.22 |

FOREIGN PATENT DOCUMENTS 2054868 7/1969 France .................. 219/74

Primary Examiner—Richard K. Seidel
Assistant Examiner—Karen Skillman
Attorney, Agent, or Firm—Gary C. Honeycutt; Melvin Sharp; Rhys Merrett

[57] ABSTRACT

The disclosure relates to the use of metastable state of mixed gases which, when appropriately mixed, provide better control of current and voltage conditions and subsequent arc formation properties in making balls of aluminum, copper and gold with an electronic flame-off method. The specific mixtures involve inert argon mixed with small amounts of hydrogen and neon. Exceptionally well controlled balls of uniform size result.

2 Claims, 1 Drawing Sheet

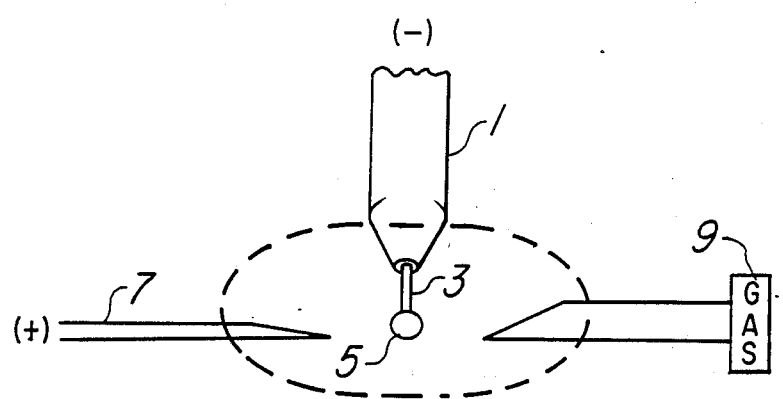

GAS MIXTURE FOR USE IN CONTROL AND FORMATION OF BALL BONDS

BACKGROUND OF THE INVENTION

1. Field of the Invention

This invention relates to a gas mixture for use in formation of ball bonds to semiconductor devices, particularly in conjunction with copper, aluminum and gold wire and, more particularly, to the atmosphere utilized during formation of such bonds.

2. Brief Description of the Prior Art

In the formation of wire bonds to the bond pads of semiconductor device, it is standard procedure to provide a capillary tube through which gold wire to be bonded to the bond pad on the semiconductor device is threaded. The wire is generally connected to a positive or negative reference voltage source. An EFO (electronic flame off) or torch, which is coupled to a source of voltage of opposite polarity to that of the wire, and which is generally formed of tungsten, is positioned closely adjacent the lower or exit tip of the capillary tube. To provide the bond, an arc is struck between the EFO and the portion of the wire extending out of the capillary tube while a predetermined atmosphere formed around the exposed wire is controlled by blowing said atmosphere around the exposed wire to first form a ball due to the surface tension and then provide the bonding step with the ball. The prior art atmosphere used was generally a reducing gas, preferably hydrogen, and an inert gas, preferably argon and was directed from a tube within a few mils of the electrode gap and around the exposed wire.

For several reasons, primarily that of cost, it has been a desire in the art to replace the gold bonding wire with a less expensive substitute, copper and aluminum being the materials of primary interest due to their good electrical conductivity and low cost. However, the basic nature of gold and its ease of working and adaptability to the semiconductor bonding process have made it difficult to replace.

In general, the major problems encountered in morphological control, primarily of aluminum wire and also of copper wire are skew or centering of the wire on top of the ball, optimum size control for compatibility with pad size and capillary and necking down of the wire above the ball.

Gases of various combinations, but mainly of a reducing or inert nature have been used most successfully. The overall problem of skew or lack of symmetry between the aluminum wire and ball center is due mainly to the surface tension resulting from the aluminum oxide formation after melting when the wire tip forms a ball. In addition, all other factors being fixed, the breakdown voltage, $V_b$, is directly dependent upon the gas atmosphere of the arc and the electrode spacing. This is essentially Paschen's Law, where $V_b$=nd, and n=gas density (or a function of pressure from ideal gas law assumption) and d=electrode spacing. However, the law will show deviations for impurities, gas mixtures and electrode material variations. In particular, where inert gases are involved with metastable states, very low $V_b$'s are possible. This is a consequence of the Penning effect and their low electric strengths result from the absence of low energy excited states.

Various gases and combinations of gases used in aluminum and copper ball formation in the prior art were nitrogen, argon and hydrogen, neon and argon, argon and water vapor and others. Argon appears to be the most useful and practical and, when combined with hydrogen in small amount (about 1% hydrogen), provides the best ball formation. The advantages of using such a mixture over argon alone are several and highlights of the mechanisms are described hereinbelow.

The dissociation of molecules is a predominant mechanism in heat transfer in the arc. Energy absorbed from the arc in dissociation is released when they are reformed (such as $N_2$=2N). The temperature (energy) available for melting at a surface is, therefore, increased by the heat of dissociation. Improved heat transfer by atomic species is advantageous in the melting processes resulting from arc generation. Argon, for example, has no dissociation processes and results in relatively poor heat transfer or only those of conduction and radiation. Heat transfer by diffusion of dissociated atoms accounts for a large part of the arc's useful temperature and would seem, at first, to be the more useful process. Some compensation can be obtained, however, while still using argon in combination with other gases. For example, it is also observed in the EFO arc that argon alone does not provide the best morphology observed in aluminum ball formation. This is partially due to aluminum oxide formation from trace oxygen from the air which is probably always present around the electrodes. When some hydrogen is present in the argon, the power required to create the arc and form the ball is considerably less (about 15 to 20%). The hydrogen also reduces the oxide formation on the aluminum or is oxidized itself, thereby eliminating some available oxygen. In any event, the hydrogen minimizes the surface tension of the aluminum ball exterior and aids in the formation of smooth, symmetric balls. Additionally, the argon-hydrogen mixture results in lowering of the breakdown voltage and improves gaseous conductivity, presumably via the Penning effect, which causes some ionization of the metastable argon. This can be very beneficial in the EFO process.

Inert gases have high ionization potentials or require relatively high energies to remove their outer electrons. However argon, for example, can be relatively easily promoted to a metastable excited state, excitation being removal of the outermost electrons at a distance but not beyond nuclear influence. The collision reaction involving the metastable, excited species, results in easier ionization than for normally excited atoms. By strict definition, "metastable" refers to energy levels from which the excited electrons cannot return to the ground state directly by emission of radiation. Lifetimes of these states are long compared to other types of excited states. The longer lifetime of an atom in a metastable state results in a pickup of sufficient additional energy when colliding with an electron to cause ionization, even though the electron does not have enough energy to ionize an atom in its ground state. The result is that ionization can occur in argon, even though the discharge potential may be lower than the ionization potential.

The presence of metastable atoms has a considerable effect on gas conductivity if only a small amount of atoms of a different element having a lower ionization potential than the metastable are present. In the case of argon and hydrogen, where argon is only slightly higher in ionization potential, the argon should produce ionization of the hydrogen particle. Because of this Penning effect (formerly called "collisions of the second kind") and the relative energy relationships in operation here, increased and sustained conductivity can be more easily maintained than by use of a monoatomic gas alone. It appears, therefore, that the presence of hydrogen is advantageous and practical in the EFO arc for several reasons.

It is also well observed that too much hydrogen causes high porosity as with water in argon. It has been long considered that molten aluminum absorbs hydrogen preferentially and that this is due to the reduction of water by the aluminum and freeing of hydrogen which goes into the melt and forms voids as its solubility lessens upon solidification of the melt. It is probable that the better skew behavior, shape factors and even more controlled ball formation, aside from the void problem, are due to a slower cooling resulting from the formation of boehmite (AlOOH) and gibbsite (Al(OH)$_3$) rather than Al$_2$O$_3$ only from a dry oxidation. These two hydrated oxides have higher thermal expansion and less accommodating structures to fit the aluminum surface as it solidifies. Work done with argon having from 4% hydrogen to up to 10% hydrogen has been found to produce high porosity and variable ball size. It is therefore apparent that these prior art gas mixtures have demonstrated problems, especially in conjunction with bonding of aluminum wire to semiconductor device pads.

SUMMARY OF THE INVENTION

In accordance with the present invention, the above noted problems of the prior art are minimized and there is provided an atmosphere for use, primarily in conjunction with bonding of aluminum wire, but also in conjunction with copper and gold wire, to pads on semiconductor devices.

Briefly, in accordance with the present invention, the above noted atmospheres of the prior art are replaced by an atmosphere which comprises, preferably, from about 0.5 to about 10% neon, from about 10 to about 0.5% hydrogen and the remainder argon. The neon and hydrogen in combination preferably comprise up to about 10% of the atmosphere and, preferably, about 5% of the atmosphere. A preferred atmosphere which has provided excellent results comprises 1% hydrogen, 4% neon and the rest argon. The neon has a much higher ionization potential than the argon and collisions between the two result in further ionization of the argon which, for the above mixture, provides an added ionization factor beyond any provided by the hydrogen alone since the hydrogen content is small, it is essentially maximized. Other gases which can be used in place of neon and/or argon are nitrogen (which provides poor results), krypton, xenon radon, etc. However these gases are not commercially practical.

Overall, the breakdown voltage is reduced due to the Penning effect again, but for reasons not well understood, the ball size is somewhat reduced in a controlled manner, and probably due to less power now being required to sustain the arc. The neon addition produces a different quantity of secondary electrons. The ratio, therefore, of primary and secondary electrons and ionic species, along with different energetic relationships, due to different metastable reactants, produces some significant changes in the arc's temperature and its behavior. A change in current density at the cathode, through ion impact, etc. brought about by any changes in the emission process, will have an effect on the melting phenomenon. The effect of added metastable ionization is beneficial. Additionally, the symmetry is even more consistent.

BRIEF DESCRIPTION OF THE DRAWING

The FIGURE is a schematic arrangement of a wire bonding apparatus as used in conjunction with the present invention.

DESCRIPTION OF THE PREFERRED EMBODIMENT

Referring now to the FIGURE, there is shown an arrangement form bonding wire to a bond pad of a semiconductor device. The bonding arrangement includes a capillary 1 having a wire 3 threaded through the hollow interior thereof and extending out of the lower end thereof, the wire being connected to the negative terminal of a voltage source. A ball 5 is shown at the terminus of the lower end of the wire 3, this ball being formed after striking of an arc in standard manner as will be discussed hereinbelow.

An EFO or torch 7 is positioned closely adjacent the lower end of the wire 3, the EFO being coupled to a positive voltage source of sufficiently high potential to strike an arc between the EFO and the wire upon application of the voltage thereto. A source of gas 9, in this case a mixture composed of 1% hydrogen, 4% neon and the rest argon blows the gas from the gas source from a point closely adjacent the lower end of the wire 3 to form an atmosphere of said gas around said wire, whereby, when the arc is struck from the EFO 7 to the wire, the exposed wire is entirely within said gas. The surface tension at the end of the wire 3 will now cause the ball 5 to form, the capillary 1 with wire and ball extending therefrom now being applied to the bond pad of a semiconductor in standard manner to form a bond.

As stated hereinabove, the addition of neon to the argonhydrogen mixture provides the beneficial results above listed.

Though the invention has been disclosed with respect to a specific preferred embodiment thereof, many variations and modification will immediately become apparent to those skilled in the art. It is therefore the intention that the appended claims be interpreted as broadly as possible in view of the prior art to include all such variations and modifications.

I claim:

1. A method of bonding a wire to a semiconductor bonding pad, comprising the steps of:
    (a) providing a wire taken from the class consisting of aluminum, copper and gold,
    (b) providing an atmosphere surrounding said wire comprising from about 0.5 to about 10% neon, from about 10 to about 0.5% hydrogen, and the remainder essentially argon, and
    (c) forming an electric arc extending to said wire.

2. The method of claim 1 wherein said neon is about 4% and said hydrogen is about 1%.

* * * * *